US006776880B1

(12) United States Patent
Yamazaki

(10) Patent No.: US 6,776,880 B1
(45) Date of Patent: Aug. 17, 2004

(54) METHOD OF FABRICATING AN EL DISPLAY DEVICE, AND APPARATUS FOR FORMING A THIN FILM

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/619,486

(22) Filed: Jul. 19, 2000

(30) Foreign Application Priority Data

Jul. 23, 1999 (JP) .......................... 11-209221

(51) Int. Cl.⁷ .................. C23C 14/34; B05C 11/00; B05C 3/00; B05C 3/02
(52) U.S. Cl. ................ 204/192.15; 204/298.25; 118/723 E; 118/729; 118/600; 118/416; 427/66; 427/250; 427/372.2; 427/404
(58) Field of Search ............... 204/298.25, 192.15, 204/192.22; 118/723 E, 729, 58, 600, 416; 427/66, 250, 372.2, 404

(56) References Cited

U.S. PATENT DOCUMENTS

| | | | |
|---|---|---|---|
| 4,885,211 A | 12/1989 | Tang et al. | 428/457 |
| 4,951,601 A | 8/1990 | Maydan et al. | 118/719 |
| 5,550,066 A | 8/1996 | Tang et al. | 437/40 |
| 5,643,685 A * | 7/1997 | Torikoshi | 428/690 |
| 5,817,366 A | 10/1998 | Arai et al. | |
| 6,049,167 A | 4/2000 | Onitsuka et al. | 313/512 |
| 6,132,280 A | 10/2000 | Tanabe et al. | 445/58 |
| 6,280,861 B1 | 8/2001 | Hosokawa et al. | 428/690 |

OTHER PUBLICATIONS

JP 60-121616 A (abstract).*
Specification and Drawings of U.S. patent application Ser. No. 09/615,264, "El Display Device and A Method of Manufacturing the Same", Shunpei Yamazaki, Jun. 13, 2000.
Specification and Drawings of U.S. patent application Ser. No. 09/724,002, "Film Deposition Apparatus and A Method of Manufacturing A Light Emitting Device Using The Apparatus", Shunpei Yamazaki et al., Nov. 28, 2000.

* cited by examiner

Primary Examiner—Steven H. VerSteeg
(74) Attorney, Agent, or Firm—Eric J. Robinson; Robinson Intellectual Property Law Office, P.C.

(57) ABSTRACT

A plurality of processing chambers are connected to a common chamber (103 in FIG. 1), and they comprehend a processing chamber for oxidation (107), a processing chamber for solution application (108), a processing chamber for baking (109), and processing chambers for vapor-phase film formation (110, 111). Owing to a thin-film forming apparatus of such construction, it is permitted to fabricate an EL (electroluminescence) element employing a high-molecular EL material, without touching the open air. Thus, an EL display device of high reliability can be fabricated.

26 Claims, 6 Drawing Sheets

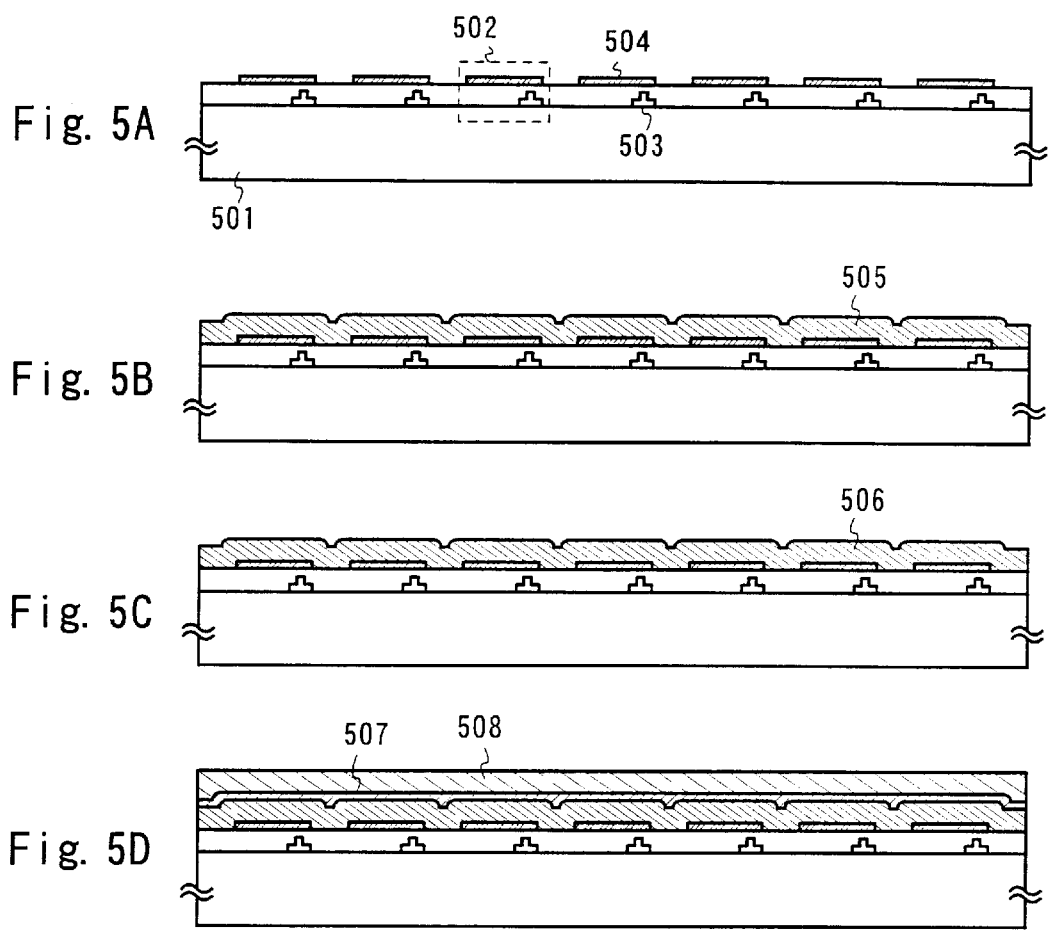

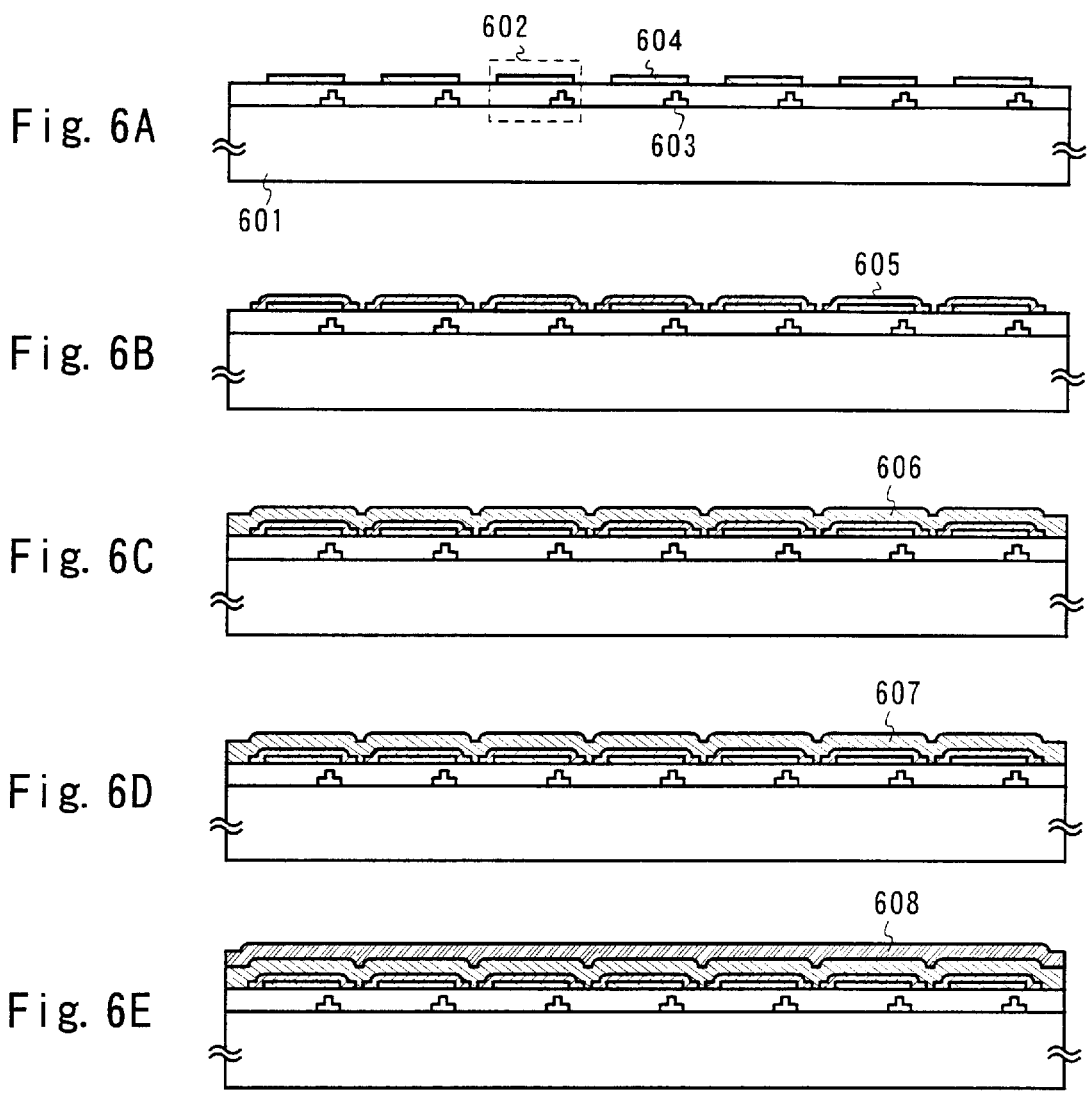

METHOD OF FABRICATING AN EL DISPLAY DEVICE, AND APPARATUS FOR FORMING A THIN FILM

BACKGROUND OF THE INVENTION

1. Field of the Invention

The present invention relates to a thin-film forming apparatus which is employed for the fabrication of a display device having an EL (electroluminescence) element (hereinbelow, termed "EL display device"), and to a method of fabricating the EL display device as employs the thin-film forming apparatus.

2. Description of the Related Art

In recent years, researches have been vigorously made in EL display devices each of which has an EL element as a spontaneous emission type element. In particular, notice has been taken of an organic EL display device which employs an organic material as an EL material. The organic EL display device is also called the "organic EL display (OELD)" or "organic light emitting diode (OLED)".

Unlike a liquid crystal display device, the EL display device is of spontaneous emission type and therefore has the merit of involving no problem on a view angle. In other words, the EL display device is more suitable than the liquid crystal display device as a display which is used outdoors, and its application in various forms has been proposed.

The EL element has a construction in which an EL layer is sandwiched in between a pair of electrodes, and in which this EL layer has a multilayer structure ordinarily. Typically mentioned is the multilayer structure of "hole transporting layer/light emitting layer/electron transporting layer" proposed by Tang et al., Eastman Kodak Company. The multilayer structure exhibits a very high emission efficiency, and most of the EL display devices being currently under research and development adopt this structure.

Herein, a predetermined voltage is applied to the EL layer of the above structure by the pair of electrodes, whereby light is emitted owing to the recombination of carriers taking place in the light emitting layer. There are two sorts of schemes for the light emission; a scheme wherein the EL layer is formed between two stripe-like electrodes disposed orthogonally to each other (simple matrix scheme), and a scheme wherein the EL layer is formed between pixel electrodes connected to TFTs and arrayed in the shape of a matrix, and a counter electrode (active matrix scheme).

Meanwhile, the EL materials of the hole transporting layer, the light emitting layer, etc. are broadly classified into two; a low molecular material, and a high molecular material. While materials mainly including $Alq_3$ have been known for a low-molecular light emitting layer for a long time, a high-molecular (polymeric) light emitting layer has been noticed especially in Europe in recent years. Typically mentioned are PPV (polyphenylene vinylene), PVK (polyvinyl carbazole), polycarbonate, etc.

The reasons why the high-molecular EL material is noticed are the points that it can be formed into the layer by a simple method of forming a thin film, such as spin coating process (also termed "solution application process"), dipping process, printing process or ink jet process, and that it is higher in the thermal stability as compared with the low molecular material.

Usually, the low-molecular EL material is formed into the layer by vacuum evaporation. That is, ordinarily the EL material is successively stacked without breaking a vacuum in a vacuum evaporator. Besides, an electrode of small work function is employed as the electrode acting as the cathode of the EL element, and also this cathode is ordinarily formed in succession to the EL material.

The EL material is extraordinarily liable to oxidize, and the oxidation is readily promoted even by the presence of a slight water content till the degradation of this EL material. In case of forming the EL element, therefore, the surface of the anode thereof being the lowermost layer is first preprocessed to eliminate moisture etc., whereupon the EL material and the cathode are successively formed on the anode without breaking a vacuum. On this occasion, the EL material and the cathode are sometimes deposited on the selected parts of the anode by employing a shadow mask or the like, and all the processing steps are performed in an evacuated processing chamber even in such a case.

This holds true also of the high-molecular EL material. Even in case of the spin coating process etc. which are not a thin-film forming expedient in a vacuum, it is important for the suppression of the degradation of the EL material that the EL material is prevented from being exposed in the atmospheric air which contains moisture.

SUMMARY OF THE INVENTION

The present invention has been made in order to fulfill the above requirements, and has for its object to provide a thin-film forming apparatus which is the most favorable for the fabrication of an EL display device employing a high-molecular EL material.

Another object is to provide a method of fabricating an EL display device of high reliability by utilizing such a thin-film forming apparatus.

The purport of the present invention consists in that an EL display device is fabricated using a thin-film forming apparatus of multi-chamber system (also termed "cluster tool system") or in-line system which integrally comprehends means for forming a thin film made of a high-molecular EL material (hereinbelow, the thin film shall be sometimes termed the "high-molecular EL layer"), and means for forming a cathode.

While there are various methods of forming the film of the high-molecular EL material, the adoption of a spin coating process is favorable. The spin coating process is an expedient wherein a solute to become the main component of the thin film is dissolved in a solvent, the resulting solution is applied by a spinner or the like, and the solvent is subsequently volatilized by a baking process, thereby to form the thin film.

In the present invention, the solution containing the high-molecular EL material is applied by the spinner, and the solvent is volatilized by performing a heat treatment at a temperature at which the high-molecular EL material is not crystallized (concretely, at a temperature which is not higher than a glass transition temperature). As a result, the high-molecular EL layer is formed on a substrate. In other words, the formation of the high-molecular EL layer necessitates means for applying the solution containing the high-molecular EL material, and means for baking after the application.

Besides, the high-molecular EL material is weak against oxygen likewise to a low-molecular EL material, and an electrically conductive film to be provided after the formation of the high-molecular EL layer should desirably be formed so that this high-molecular EL layer may not be exposed to an environment containing moisture or oxygen. It can accordingly be said that the means for forming the high-molecular EL layer (in the present invention, means for executing the spin coating process), and the means for forming the conductive film to serve as the cathode (or an anode), on the high-molecular EL layer (means for executing a vapor-phase film formation process such as vacuum evaporation or sputtering) should desirably be installed in the identical thin-film forming apparatus.

The present invention achieves the above requirements by the thin-film forming apparatus of multi-chamber system, and consists in technology for fabricating the EL display device of high reliability by adopting such a thin-film forming apparatus.

BRIEF DESCRIPTION OF THE DRAWINGS

FIGS. 5(A) through 5(D) are sectional views showing a process for fabricating an active matrix type EL display device; and FIGS. 6(A) through 6(E) are sectional views showing another process for fabricating an active matrix type EL display device.

PREFERRED EMBODIMENTS OF THE INVENTION

[Embodiment 1]

An apparatus for forming a thin film in an embodiment of the present invention will be described with reference to FIG. 1. The apparatus shown in FIG. 1 serves to fabricate an EL display device which includes an EL element employing a transparent electrically-conductive film as an anode, a high-molecular EL layer as a light emitting layer, and a metal film as a cathode. The metal film containing an element that belongs to the group-1 or group-2 of a periodic table.

Figure 1:
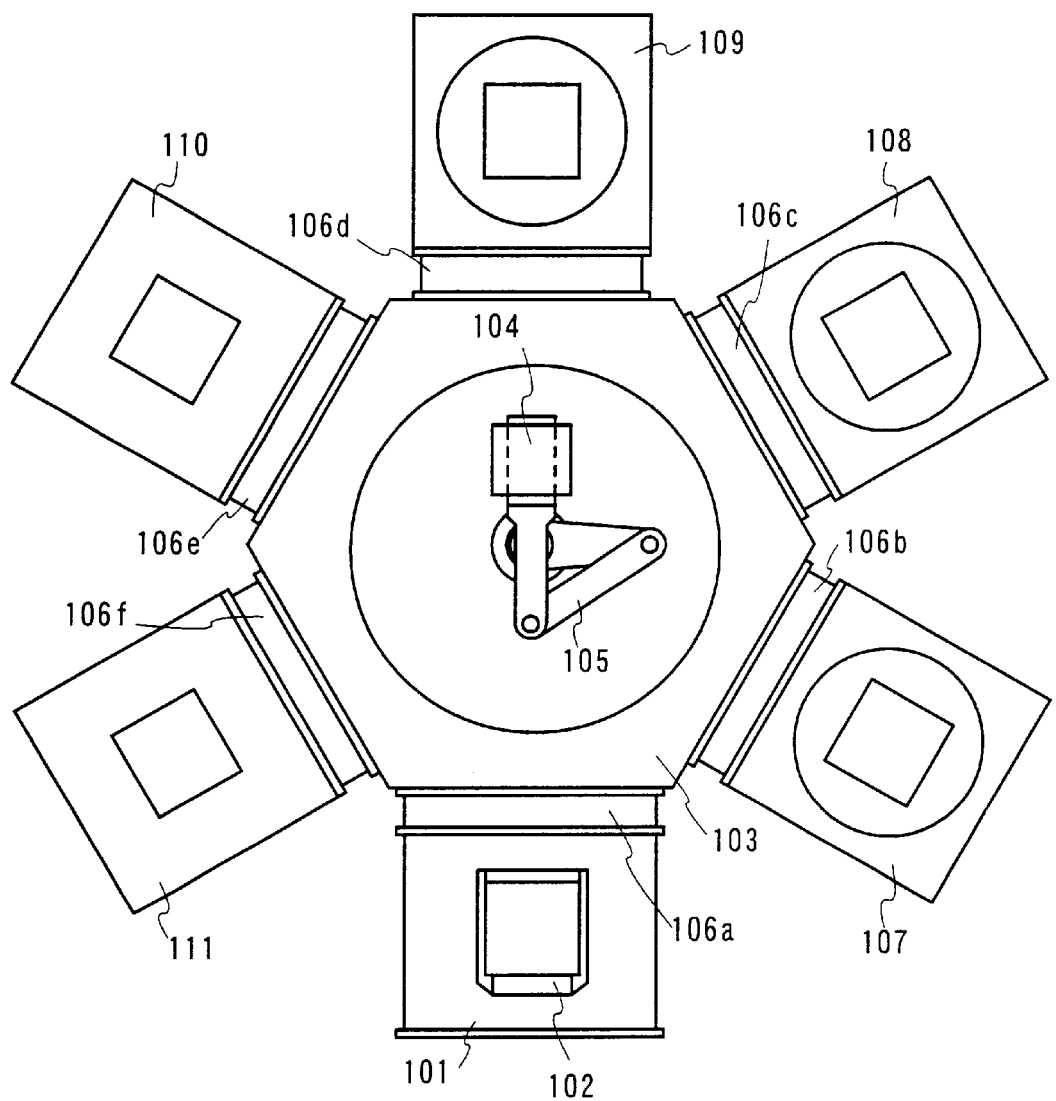
FIG. 1 is a schematic plan view showing the construction of a thin-film forming apparatus embodying the present invention.

Referring to FIG. 1, numeral 101 designates a transport chamber into or out of which a substrate is taken, and which is also called a "load lock chamber". A carrier 102 on which the substrate is set is arranged here. Incidentally, the transport chamber 101 may well be separated for taking the substrate inwards and for taking the substrate outwards.

In addition, numeral 103 designates a common chamber which includes a mechanism ("transport mechanism") 105 for transporting the substrate 104. A robot arm or the like for handling the substrate 104 is one example of the transport mechanism 105.

Besides, a plurality of processing chambers (indicated at numerals 107~111) are respectively connected to the common chamber 103 through gates 106a–106f. In the construction shown in FIG. 1, the interior of the common chamber 103 is in a normal-pressure atmosphere which is filled up with an inert gas (preferably, nitrogen gas, helium gas, neon gas or argon gas). Since, however, the respective chambers 101, 107–111 can be completely cut off from the common chamber 103 by the corresponding gates 106a~106f, gastight closed spaces can be defined.

It is accordingly permitted to perform processing in vacuum by disposing a vacuum pump for each chamber. Usable as the vacuum pump is a rotary oil pump, a mechanical booster pump, a molecular turbopump or a cryopump, among which the cryopump effective for eliminating moisture is especially favorable.

The processing chamber indicated at numeral 107 serves to perform an oxidation process for bettering the surface of the transparent electrically-conductive film formed on the substrate (hereinbelow, the processing chamber 107 shall be termed the "processing chamber for oxidation"). Here, preprocessing is executed for matching the junction surface potential of the transparent conductive film with the surface potential of the high-molecular EL layer. Techniques for the preprocessing are the following three:

(1) Surface oxidation process which is based on an oxygen plasma utilizing a parallel-plate glow discharge.

(2) Surface oxidation process which is based on ozone produced by irradiation with ultraviolet light.

(3) Surface oxidation process which is based on oxygen radicals produced by a plasma.

Although the thin-film forming apparatus according to the present invention may well be furnished with the processing chamber for performing any of the three surface oxidation processes, the method wherein the ozone is produced by the ultraviolet light irradiation so as to implement the surface oxidation of the transparent conductive film is simple and favorable. Moreover, organic substances on and in the surface of the transparent conductive film are eliminated by the surface oxidation based on the ozone. Further, it is effective to satisfactorily eliminate moisture by simultaneously heating the substrate on this occasion.

By the way, in evacuating the processing chamber for oxidation, 107, this chamber may be completely cut off from the common chamber 103 by the gate 106b so as to implement the evacuation in a gastight state.

Next, the processing chamber indicated at numeral 108 serves to apply a solution containing the high-molecular EL material by the spin coating process (hereinbelow, the processing chamber 108 shall be termed the "processing chamber for solution application"). Since, as explained before, the EL material is very weak against moisture, the interior of the processing chamber for solution application, 108 needs to be always held in an inert atmosphere.

In this case, the gate 106c also plays the role of a shutter which prevents the organic solution from scattering. In bringing the interior of the processing chamber 108 into a lowered-pressure state, this chamber may be completely cut off from the common chamber 103 by the gate 106c.

Next, the processing chamber indicated at numeral 109 serves to bake a thin coating film formed in the processing chamber for solution application, 108 (hereinbelow, the processing chamber 109 shall be termed the "processing chamber for baking"). Here, the thin film is heat-treated, thereby to remove the excessive part of the organic solution and to perform a process for forming the high-molecular EL layer. Insofar as the atmosphere of the baking process is an inert gas, it may be under the normal pressure. Since, however, the organic solvent volatilizes, the baking process should preferably be implemented in vacuum. In that case, the processing chamber 109 may be cut off from the common chamber 103 by the gate 106d.

Next, the processing chamber indicated at numeral 110 serves to form the electrode by a vapor-phase film formation process (hereinbelow, the processing chamber 110 shall be termed the "processing chamber for first vapor-phase film formation"). Vacuum evaporation or sputtering is mentioned as the vapor-phase film formation process. Here, the process is used for the purpose of forming the cathode on the high-molecular EL layer, and hence, the vacuum evaporation being less prone to inflict damages is more preferable. In either case, the processing chamber 110 is cut off from the common chamber 103 by the gate 106e, and the film formation is implemented in vacuum.

By the way, with the thin-film forming apparatus shown in FIG. 1, the cathode is formed in the processing chamber for first vapor-phase film formation, 110. Any known material may be employed as the material of the cathode. In addition, that surface of the substrate 104 which is subjected to the vacuum evaporation (that side of the substrate 104 which is formed with the high-molecular EL layer) may conform to either of a face-up scheme and a face-down scheme.

The face-up scheme is very simple for the reason that the substrate 104 transported from the common chamber 103 may be directly set on a susceptor. With the face-down scheme, the transport mechanism 105 or the processing chamber for first vapor-phase film formation, 110 needs to be previously furnished with a mechanism for turning the substrate 104 inside out, so that the transport becomes complicated. This face-down scheme, however, attains the advantage that contaminants adhere little.

By the way, in the case where the vacuum evaporation process is performed in the processing chamber for first vapor-phase film formation, 110, an evaporation source needs to be included beforehand. In this regard, a plurality of evaporation sources may well be mounted. Besides, the evaporation source or sources may conform to either of a resistance heating type and an EB (electron beam) type.

Next, the processing chamber indicated at numeral 111 serves to form an electrode by a vapor-phase film formation process (hereinbelow, the processing chamber 111 shall be termed the "processing chamber for second vapor-phase film formation"). Here, the electrode to be formed is an auxiliary electrode which assists the cathode. In addition, vacuum evaporation or sputtering can be employed, and the former is more preferable because of being less prone to inflict damages. In either case, the processing chamber 111 is cut off from the common chamber 103 by the gate 106f, and the film formation is implemented in vacuum.

Besides, in the case where the vacuum evaporation is performed as the vapor-phase film formation process, an evaporation source needs to be mounted. The evaporation source may be the same as that of the processing chamber for first vapor-phase film formation, 110, and shall therefore been omitted from description here.

The metal film which is often employed as the cathode, is one which contains the element belonging to the group-1 or group-2 of the periodic table. Since such a metal film is liable to oxidize, the surface thereof should desirably be protected beforehand. Besides, since the required thickness of the metal film is small, an electrically conductive film of low resistivity (the auxiliary electrode mentioned above) is provided as an auxiliary, thereby to lower the resistance of the cathode. Simultaneously, the protection of the cathode is attained by the conductive film of low resistivity. A metal film whose main component is aluminum, copper or silver is employed as the auxiliary conductive film.

Incidentally, the above processing steps (evacuation, transport, film formation process, etc.) can be performed by a computerized fully automatic control which is based on a touch panel and a sequencer.

The most important features of the thin-film forming apparatus constructed as described above, consist in that the formation of the EL layer is done by the spin coating process, and that the means therefor is installed in the thin-film forming apparatus of multi-chamber system, together with the means for forming the cathode. Accordingly, the processing steps which begin with the step of oxidizing the surface of the anode made of the transparent conductive film and which end in the step of forming the auxiliary electrode, can be performed without exposing the substrate structure to the open air anytime.

As a result, it is permitted to form the high-molecular EL layer immune against degradation, by the simple means, and to fabricate the EL display device of high reliability.

[Embodiment 2]

Figure 2:
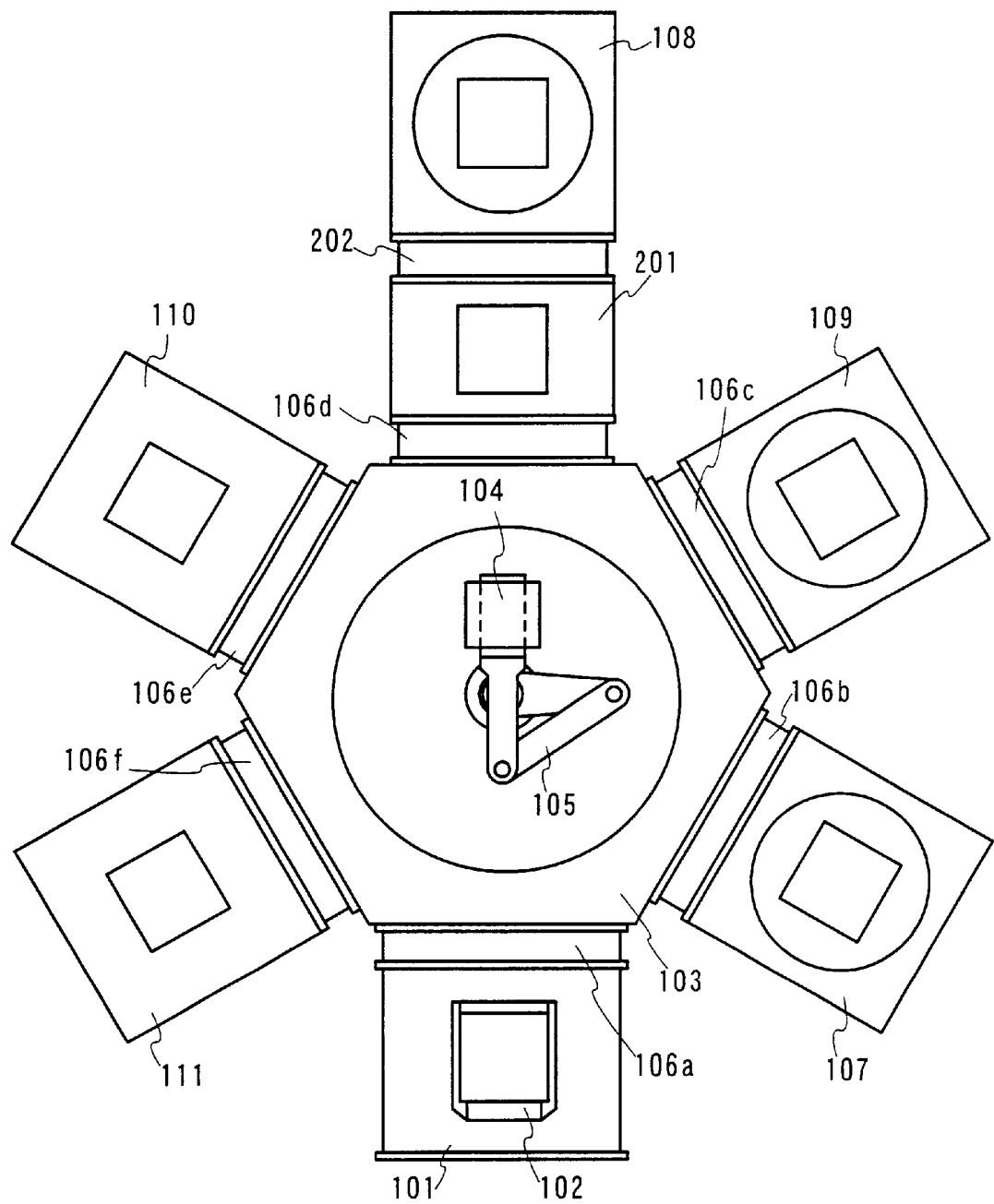
FIG. 2 is a schematic plan view showing the construction of a thin-film forming apparatus in another embodiment of the present invention.

In this embodiment, an example in which the thin-film forming apparatus shown in FIG. 1 is partially altered will be described with reference to FIG. 2. Concretely, this embodiment is so constructed that a processing chamber for evacuation, 201 is interposed between the common chamber 103 and the processing chamber for solution application, 108. Incidentally, regarding description on the parts other than the altered point, Embodiment 1 can be cited.

Although Embodiment 1 has mentioned the example in which the common chamber 103 is filled up with the inert gas so as to have its interior kept under the normal pressure, the substrate 104 may well be transported in vacuum. In this case, the pressure of the interior of the common chamber 103 may be lowered to several mTorr through several tens mTorr. On this occasion, the processing chamber for solution application, 108 is filled up with the inert gas so as to have its interior kept under the normal pressure. Accordingly, the difference between the internal pressures of the chambers 103 and 108 must be overcome.

In this embodiment, therefore, the pressure of the processing chamber for evacuation, 201 is first lowered to that of the common chamber 103, and the gate 106d is opened in the lowered-pressure state so as to transport the substrate 104 into the processing chamber 201. After the gate 106d has been shut, the interior of the processing chamber for evacuation, 201 is purged with an inert gas. When the internal pressure of the chamber 201 has recovered the normal pressure, a gate 202 is opened so as to transport the substrate 104 into the processing chamber for solution application, 108. The transport here may be done stage by stage, or may well be done with dedicated transport means.

Further, when the step of solution application has ended, the gate 202 is opened so as to transport the substrate 104 into the processing chamber for evacuation, 201, and this chamber 201 is evacuated in a state where the gate 202 and the gate 106d are shut. When the interior of the processing chamber for evacuation, 201 has reached the lowered-pressure state of the common chamber 103 in due course, the gate 106d is opened so as to transport the substrate 104 into the common chamber 103.

Incidentally, although the processing chamber for baking, 109 is disposed in this embodiment, the susceptor of the processing chamber for evacuation, 201 may well be made heatable so as to perform the step of baking here. Degassing can be suppressed by evacuating the processing chamber 201 after the baking.

Owing to the construction as described above, it is permitted to handle the substrate 104 in vacuum in all the chambers except the processing chamber for solution application, 108. If the interior of the common chamber 103 is in the lowered-pressure state, a time period in which a desired internal pressure is reached can be shortened in evacuating the processing chamber for surface oxidation, 107, the processing chamber for baking, 109, the processing chamber for first vapor-phase film formation, 110 or the processing chamber for second vapor-phase film formation, 111, so that the throughput of the thin-film forming apparatus can be enhanced.

[Embodiment 3]

In this embodiment, an example in which the thin-film forming apparatus shown in FIG. 1 is partially altered will be described with reference to FIG. 3. Concretely, this embodiment is so constructed that the transport chamber 101 is furnished with a glove box 301 and a pass box 302. Incidentally, regarding description on the parts other than the altered point, Embodiment 1 can be cited.

The glove box 301 is connected to the transport chamber 101 through a gate 303. Processing for finally enveloping the EL element in a sealed space, is performed in the glove box 301. This processing is one in which the substrate 104 subjected to all the processing steps (the substrate 104 having returned to the transport chamber 101 after the processing steps in the thin-film forming apparatus shown in FIG. 3) is protected from the open air, and which employs such an expedient as mechanically enveloping the substrate 104 with a sealing material (also termed "housing material") or enveloping it with a thermosetting resin or a ultraviolet-setting resin.

Usable as the sealing material is any of materials such as glass, ceramics and metals. In a case where light is caused to emerge onto the side of the sealing material, this material must be light-transmissible. Besides, the sealing material and the substrate 104 subjected to all the processing steps are stuck together with the thermosetting resin or the ultraviolet-setting resin, and the resin is set by a heat treatment or a treatment of irradiation with ultraviolet light, thereby to define the sealed space. It is also effective that a drying agent such as barium oxide is put in the sealed space.

Alternatively, the EL element can be enveloped by only the thermosetting resin or the ultraviolet-setting resin without employing the sealing material. In this case, the thermosetting resin or the ultraviolet-setting resin may be applied and set so as to cover, at least, the side surfaces of the substrate 104 subjected to all the processing steps. This contrivance serves to prevent moisture from intruding from film interfaces.

With the construction of the thin-film forming apparatus shown in FIG. 3, a mechanism for the irradiation with ultraviolet light (hereinbelow, termed the "ultraviolet irradiation mechanism"), 304 is mounted inside the glove box 301. The ultraviolet-setting resin is set by the ultraviolet light emitted from the ultraviolet irradiation mechanism 304.

Incidentally, although operations in the glove box 301 may well be manual, a structure in which the operations are mechanically executed under a computer control is favorable. In the case of employing the sealing material, it is favorable to incorporate a mechanism for applying a sealant (here, the thermosetting resin or the ultraviolet-setting resin) as is employed at the step of assembling the cell of a liquid crystal, a mechanism for sticking substrates together, and a mechanism for setting the sealant.

Besides, the interior of the glove box 301 can have its pressure lowered by attaching a vacuum pump. In a case where the step of envelopment is mechanically performed by robot motions, it is effectively done under the lowered pressure.

Next, the pass box 302 is connected to the glove box 301 through a gate 305. The pass box 302 can also have its internal pressure lowered by attaching a vacuum pump. This pass box 302 is an equipment which serves to prevent the interior of the glove box 301 from being directly exposed to the open air, and out of which the substrate 104 is taken.

As described above, with the thin-film forming apparatus of this embodiment, the substrate 104 is exposed to the open air at the stage at which the EL element has been completely enveloped in the sealed space. Therefore, the EL element can be substantially perfectly prevented from degrading due to moisture etc. That is, it is permitted to fabricate the EL display device of high reliability.

Figure 3:
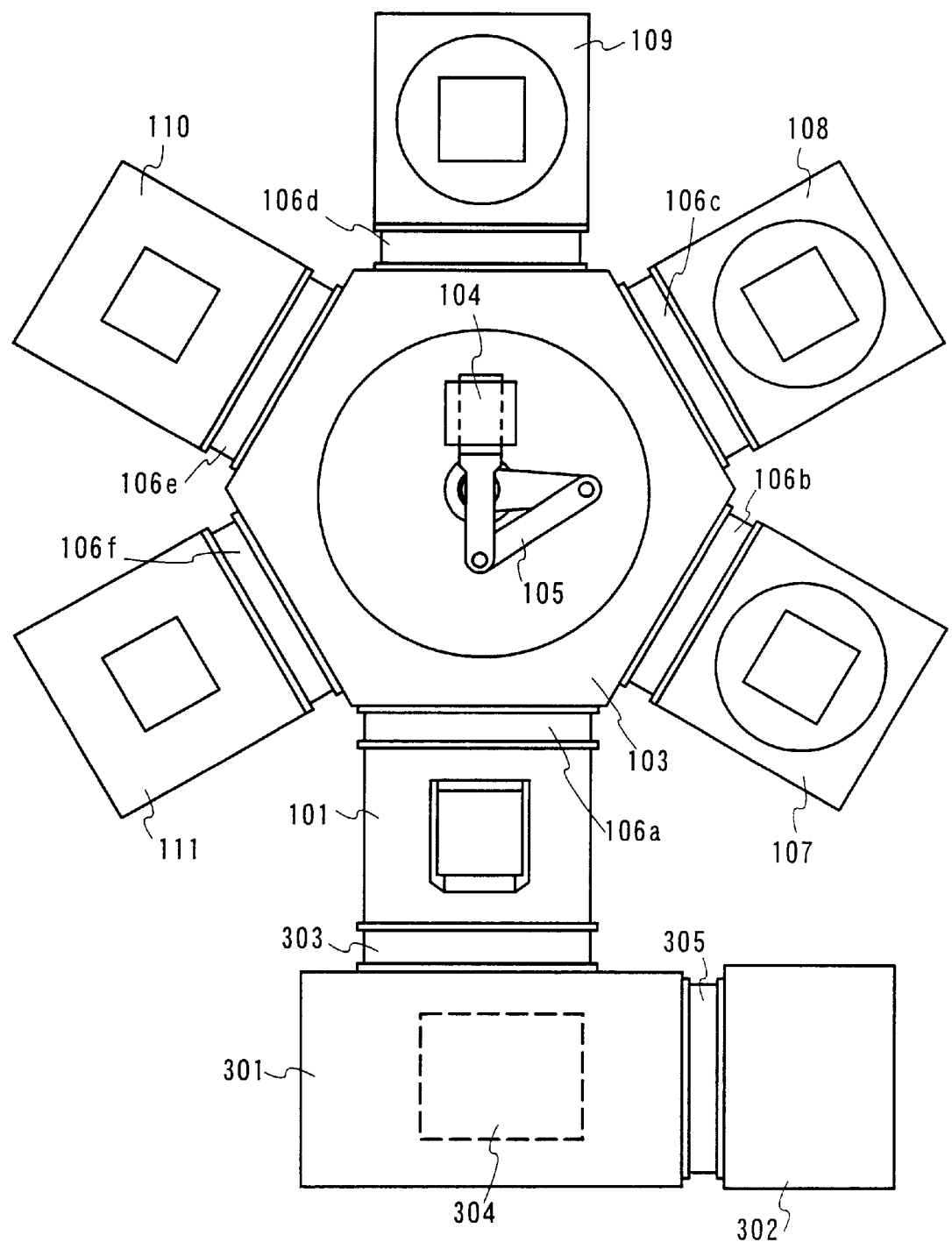
FIG. 3 is a schematic plan view showing the construction of a thin-film forming apparatus in still another embodiment of the present invention.

Incidentally, it is possible to add the feature of Embodiment 2 (the processing chamber for evacuation, 201 shown in FIG. 2) to the thin-film forming apparatus shown in FIG. 3. Thus, it is permitted to enhance the reliability of the EL display device still more.

[Embodiment 4]

In this embodiment, a case where the present invention is applied to a thin-film forming apparatus of in-line system will be described with reference to FIG. 4. By the way, this apparatus corresponds basically to a case where the thin-film forming apparatus of multi-chamber system as shown in FIG. 1 has been altered to the in-line system, so that Embodiment 1 may be cited regarding description on individual processing chambers.

Figure 4:
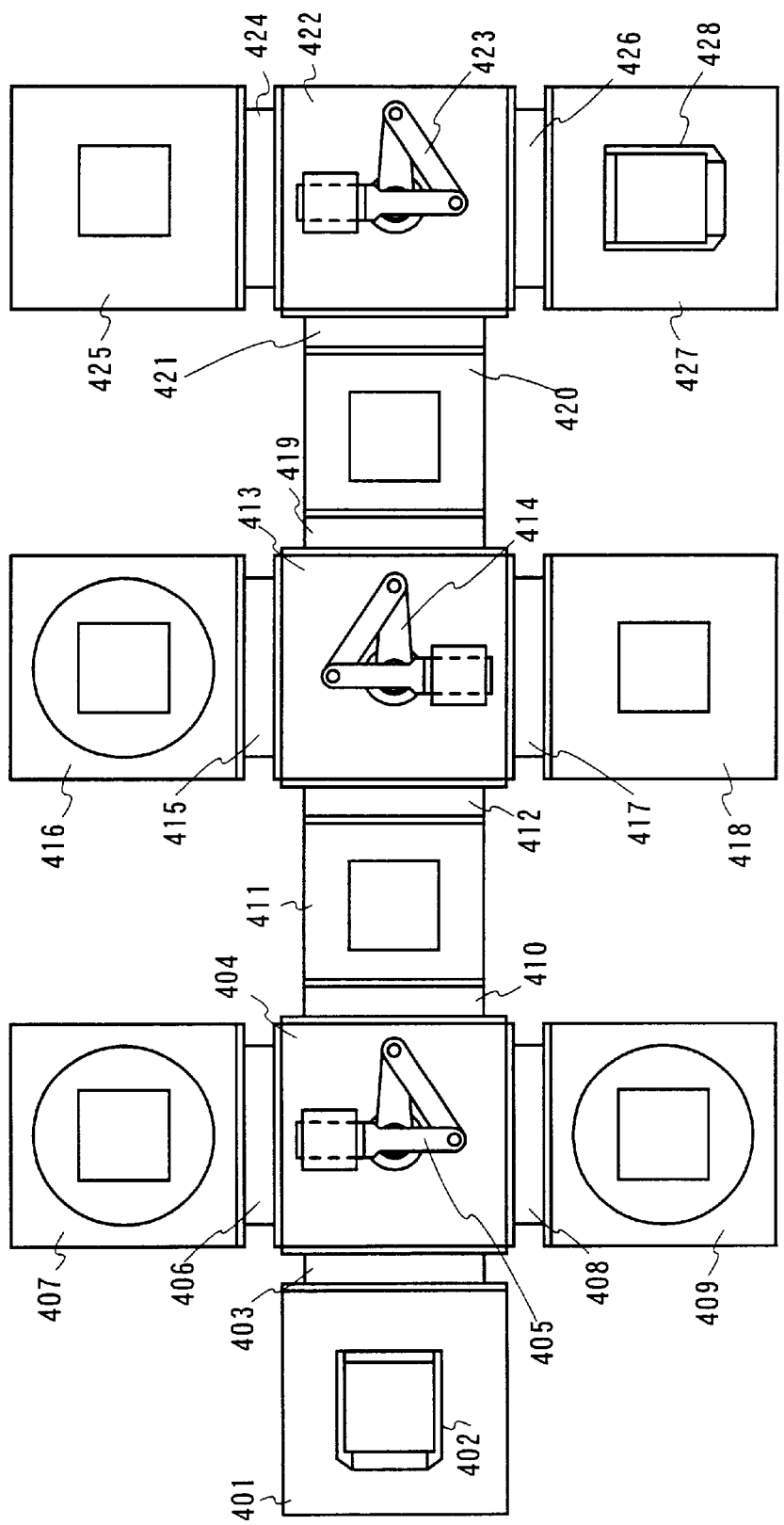
FIG. 4 is a schematic plan view showing the construction of a thin-film forming apparatus in yet another embodiment of the present invention.

Referring to FIG. 4, numeral 401 designates a first transport chamber into which a substrate is taken, and which is provided with a carrier 402. The first transport chamber 401 is connected to a first common chamber 404 through a gate 403. The first common chamber 404 is furnished with a first transport mechanism 405. In addition, a processing chamber for oxidation, 407 is connected to the first common chamber 404 through a gate 406, and a processing chamber for solution application, 409 is connected thereto through a gate 408.

The substrate processed in the processing chamber for oxidation, 407 and the processing chamber for solution application, 409 in the order mentioned, is taken into a second transport chamber 411 which is connected to the first common chamber 404 through a gate 410. A second common chamber 413 is connected to the second transport chamber 411 through a gate 412. The second common chamber 413 is furnished with a second transport mechanism 414, by which the substrate is taken out of the second transport 411.

Besides, a processing chamber for baking, 416 is connected to the second common chamber 413 through a gate 415, and a processing chamber for first vapor-phase film formation, 418 is connected thereto through a gate 417. Further, the substrate processed in the processing chamber for baking, 416 and the processing chamber for first vapor-phase film formation, 418 in the order mentioned, is taken into a third transport chamber 420 which is connected to the second common chamber 413 through a gate 419.

A third common chamber 422 is connected to the third transport chamber 420 through a gate 421. The third common chamber 422 is furnished with a third transport mechanism 423, by which the substrate is taken out of the third transport chamber 420. Besides, a processing chamber for second vapor-phase film formation, 425 is connected to the third common chamber 422 through a gate 424, and a fourth transport chamber 427 for taking out the substrate is connected thereto through a gate 426. The fourth transport chamber 427 is provided with a carrier 428.

As described above, this embodiment consists in the in-lined thin-film forming apparatus in which the plurality of processing chambers are connected to realize a through process.

By the way, a processing chamber for evacuation may well be interposed between the processing chamber for solution application, 409 and the first common chamber 404 in the same manner as in Embodiment 2. Also allowed is a construction in which, in the same manner as in Embodiment 3, a glove box and a pass box are connected to the fourth transport chamber 427, so as to take out the substrate after the envelopment of the EL element.

[Embodiment 5]

Embodiments 1–14 have exemplified the construction in which the processing chamber for oxidation, the processing chamber for solution application, the processing chamber for baking, the processing chamber for first vapor-phase film formation and the processing chamber for second vapor-phase film formation are disposed as the plurality of processing chambers. The present invention, however, is not restricted to such a combination.

If necessary, it is also allowed to dispose two or more processing chambers for solution application, or three or more processing chambers for vapor-phase film formation. Besides, the processing chamber for vapor-phase film formation may well be used for the formation of a low-molecular EL layer, apart from the formation of the metal film. It is also possible, for example, to form a light emitting layer by spin coating and then stack an electron transporting layer thereon by vacuum evaporation, or to form a hole transporting layer by spin coating and then stack a light emitting layer thereon by vacuum evaporation. Of course, a low-molecular EL layer formed by vacuum evaporation may well be overlaid with a high-molecular EL layer by spin coating.

It is also effective that an insulating film, preferably an insulating film containing silicon, is formed covering the EL element as a final passivation film. In that case, the insulating film may be formed by sputtering or vacuum evaporation in the processing chamber for vapor-phase film formation. Incidentally, a silicon nitride film or a silicon nitride oxide film whose oxygen content is low is favorable as the insulating film containing silicon.

As described above, the present invention is not restricted to the combination of the plurality of processing chambers, but the functions of processing chambers to be disposed may be properly determined by a person in charge. Incidentally, Embodiment 1 can be cited regarding description on the individual processing chambers.

[Embodiment 6]

In this embodiment, an example in which the thin-film forming apparatus of the present invention is adopted in fabricating an EL display device of active matrix type will be described with reference to FIGS. 5(A) through 5(D). By the way, in this embodiment, the apparatus described in Embodiment 1 will be taken as an example. Accordingly, the description of Embodiment 1 can be cited regarding the details of the processing steps which are performed in the individual processing chambers.

First, as shown in FIG. 5(A), pixels 502 arrayed in the shape of a matrix are formed on a glass substrate 501. Although the glass substrate 501 is employed in this embodiment, any material may be used for a substrate. However, in a case where light is emitted from an EL element onto a substrate side as in this embodiment, the substrate must be light-transmissible.

Besides, each of the pixels 502 has a TFT 503 and a pixel electrode (anode) 504, and a current to flow to the pixel electrode 504 is controlled by the TFT 503. A method of fabricating the TFTs 503 may conform to any known method of fabricating TFTs. Of course, the TFT 503 may be either a top gate type TFT or a bottom gate type TFT. (FIG. 5(A))

Further, the pixel electrode 503 is formed using a transparent electrically-conductive film such as of a compound comprising indium oxide and tin oxide (and which is called "ITO"), or a compound comprising indium oxide and zinc oxide. In this embodiment, a compound in which 10–15% of zinc oxide is mixed in indium oxide is employed.

Subsequently, the substrate shown in FIG. 5(A) is put in the carrier 102, and this carrier 102 is set in the transport chamber 101 of the thin-film forming apparatus shown in FIG. 1. Besides, the substrate is transported by the transport mechanism 105 into the processing chamber for oxidation, 107, in which the surfaces of the anodes 504 are bettered. In this embodiment, in a state where oxygen gas is introduced into the evacuated processing chamber 107, ultraviolet light is projected, and the substrate is exposed in an ozone atmosphere thus created, thereby to better the surface potentials of the pixel electrodes 504.

Subsequently, the substrate is transported into the processing chamber for solution application, 108 by the transport mechanism 105, and it is coated with a solution containing an EL material, by spin coating, thereby to form the preform 505 of a high-molecular EL layer. In this embodiment, a solution in which polyvinyl carbazole is dissolved in chloroform is employed. Of course, any other appropriate combination between a high-molecular EL material and an organic solvent may well be employed. (FIG. 5(B))

Further, the resulting substrate is transported into the processing chamber for baking, 109, in which a baking process (a heat treatment) is performed to polymerize the EL material. In this embodiment, the whole substrate is heat-treated at a temperature of 50–150° C. (more preferably, 110–120° C.) by heating a stage by means of a heater. Thus, excessive chloroform is volatilized to form the high-molecular EL layer (a polyvinyl carbazole film) 506. (FIG. 5(C)).

When the state of FIG. 5(C) has been obtained, the substrate is transported into the processing chamber for first vapor-phase film formation, 110, in which a cathode 507 made of a metal film that contains an element belonging to the group-1 or group-2 of a periodic table is formed by vacuum evaporation. In this embodiment, magnesium and silver are co-evaporated at a rate of 10:1, thereby to form the cathode 507 made of an Mg—Ag alloy.

Further, the substrate formed with the cathode 507 is taken out of the processing chamber for first vapor-phase film formation, 110 and into the processing chamber for second vapor-phase film formation, 111 by the transport mechanism 105. In the latter processing chamber 111, an electrode (auxiliary electrode) 508 whose main component is aluminum is formed on the cathode 507. Thus, the state of FIG. 5(D) is obtained.

Thereafter, a passivation film such as a silicon nitride film may well be provided by vacuum evaporation or sputtering at need. In the case of providing the passivation film, the thin-film forming apparatus may be previously equipped with a processing chamber for forming an insulating film, or the substrate may be taken out once and formed with the passivation film by another apparatus.

Besides, using the thin-film forming apparatus as shown in Embodiment 3, the EL element may well be finally enveloped before the substrate is exposed to the open air.

Incidentally, although this embodiment has exemplified the application of the thin-film forming apparatus of the present invention to the fabrication of the active matrix type EL display device, the apparatus is also applicable to the fabrication of a simple matrix type EL display device. Besides, the thin-film forming apparatus in any of Embodiments 2–5 may well be applied.

[Embodiment 7]

In this embodiment, another example in which the thin-film forming apparatus of the present invention is adopted in fabricating an EL display device of active matrix type will be described with reference to FIGS. 6(A) through 6(E). By the way, in this embodiment, the apparatus described in Embodiment 1 will be taken as an example. Accordingly, the description of Embodiment 1 can be cited regarding the details of the processing steps which are performed in the individual processing chambers.

First, as shown in FIG. 6(A), pixels 602 arrayed in the shape of a matrix are formed on a glass substrate 601. Although the glass substrate 601 is employed in this embodiment, any material may be used for a substrate.

Besides, each of the pixels 602 has a TFT 603 and a pixel electrode (cathode) 604, and a current to flow to the pixel electrode 604 is controlled by the TFT 603. A method of fabricating the TFTs 603 may conform to any known method of fabricating TFTs. Of course, the TFT 603 may be either a top gate type TFT or a bottom gate type TFT. (FIG. 6(A))

Further, the pixel electrode 603 may be formed of a film whose main component is aluminum. In this embodiment, light emitted from an EL element is caused to emerge onto the side opposite to the substrate 601 (upwards as viewed in FIG. 6(A)). On this occasion, the pixel electrode 603 functions as a reflecting electrode. It is therefore favorable to employ a material which exhibits the highest possible reflectivity.

Subsequently, the substrate shown in FIG. 6(A) is put in the carrier 102, and this carrier 102 is set in the transport chamber 101 of the thin-film forming apparatus shown in FIG. 1. Besides, the substrate is transported by the transport mechanism 105 into the processing chamber for first vapor-phase film formation, 110, in which cathodes 605 each being made of a metal film that contains an element belonging to the group-1 or group-2 of a periodic table is formed by vacuum evaporation. In this embodiment, the cathodes 605 made of an Mg—Ag alloy are formed. Incidentally, the cathodes 605 are selectively formed in correspondence with the respective pixel electrodes 604 by the vacuum evaporation which employs a mask. (FIG. 6(B))

Subsequently, the substrate is transported into the processing chamber for solution application, 108 by the transport mechanism 105, and it is coated with a solution containing an EL material, by spin coating, thereby to form the preform 606 of a high-molecular EL layer. In this embodiment, a solution in which polyphenylene vinylene is dissolved in dichloromethane is employed. Of course, any other appropriate combination between a high-molecular EL material and an organic solvent may well be employed. (FIG. 6(C))

Further, the resulting substrate is transported into the processing chamber for baking, 109, in which a baking process (a heat treatment) is performed to polymerize the EL material. In this embodiment, the whole substrate is heat-treated at a temperature of 50–150° C. (more preferably, 110–120° C.) by heating a stage by means of a heater. Thus, excessive dichloromethane is volatilized to form the high-molecular EL layer (a polyphenylene vinylene film) 607. (FIG. 6(D))

When the state of FIG. 6(D) has been obtained, the substrate is transported into the processing chamber for second vapor-phase film formation, 111, in which an anode 608 made of a transparent conductive film is formed by sputtering. In this embodiment, a compound in which 10–15% of zinc oxide is mixed in indium oxide is employed. Thus, the state of FIG. 6(E) is obtained.

Thereafter, a passivation film such as a silicon nitride film may well be provided by vacuum evaporation or sputtering at need. In the case of providing the passivation film, the thin-film forming apparatus may be previously equipped with a processing chamber for forming an insulating film, or the substrate may be taken out once and formed with the passivation film by another apparatus.

Besides, using the thin-film forming apparatus as shown in Embodiment 3, the EL element may well be finally enveloped before the substrate is exposed to the open air.

Incidentally, although this embodiment has exemplified the application of the thin-film forming apparatus of the present invention to the fabrication of the active matrix type EL display device, the apparatus is also applicable to the fabrication of a simple matrix type EL display device. Besides, the thin-film forming apparatus in any of Embodiments 2–5 may well be applied.

The present invention brings forth effects as stated below.

A processing chamber for forming the layer of a high-molecular EL material by a spin coating process, and other processing chambers for preprocessing and for forming electrodes are integrated in conformity with a multi-chamber system or an in-line system, whereby an EL element employing the high-molecular EL material can be fabricated without the problem of degradation. It is accordingly possible to sharply enhance the reliability of an EL display device employing the high-molecular EL material.

What is claimed is:

1. An apparatus comprising:
   a transport chamber into or out of which a substrate is taken;
   a common chamber including a mechanism for transporting said substrate; and
   a plurality of processing chambers respectively connected to said common chamber through gates;
   wherein said plurality of processing chambers include a processing chamber for solution application, a processing chamber for baking, and a processing chamber for vapor-phase film formation,
   wherein a processing chamber for evacuation is interposed between said processing chamber for solution application and a gate corresponding thereto.

2. An apparatus comprising:
   a transport chamber into or out of which a substrate is taken;
   a common chamber including a mechanism for transporting said substrate; and
   a plurality of processing chambers respectively connected to said common chamber through gates;
   wherein said plurality of processing chambers include a processing chamber for oxidation, a processing chamber for solution application, a processing chamber for baking, and a processing chamber for vapor-phase film formation,
   wherein a processing chamber for evacuation is interposed between said processing chamber for solution application and a gate corresponding thereto.

3. An apparatus, comprising:
   a transport chamber into or out of which a substrate is taken;
   a common chamber including a mechanism for transporting said substrate; and
   a plurality of processing chambers respectively connected to said common chamber through gates;
   wherein said plurality of processing chambers include a processing chamber for solution application, a processing chamber for baking, a processing chamber for vapor-phase film formation in which a metal film is formed, and a processing chamber for vapor-phase film formation in which an insulating film is formed, wherein a processing chamber for evacuation is interposed between said processing chamber for solution application and a gate corresponding thereto.

4. An apparatus comprising:

a transport chamber into or out of which a substrate is taken;

a common chamber including a mechanism for transporting said substrate; and a plurality of processing chambers respectively connected to said common chamber through gates;

wherein said plurality of processing chambers include a processing chamber for oxidation, a processing chamber for solution application, a processing chamber for baking, a processing chamber for vapor-phase film formation in which a metal film is formed, and a processing chamber for vapor-phase film formation in which an insulating film is formed, wherein a processing chamber for evacuation is interposed between said processing chamber for solution application and a gate corresponding thereto.

5. An apparatus according to any of claims 1 through 4, wherein said solution application is a spin-coating application.

6. An apparatus according to any of claims 1 through 4, further comprising means for applying a member selected from the group consisting of a thermosetting resin and an ultraviolet-setting resin, so as to cover, at least, side surfaces of said substrate subjected to all processing steps, and means for setting the selected resin.

7. An apparatus according to any of claims 1 through 4, further comprising means for applying a member selected from the group consisting of a thermosetting resin and an ultraviolet-setting resin, onto said substrate subjected to all processing steps, means for sticking said substrate and a sealing material together, with the selected resin, and means for setting said selected resin.

8. A method of fabricating an EL display device, comprising:

applying a solution containing an EL material onto a transparent conductive film by spin coating;

baking said solution by a heat treatment after the solution applying step, thereby to form a thin film made of said EL material; and forming a metal containing element belonging to at least one of the group-1 and group-2 of a periodic table, on said thin film made of said EL material and by either of vacuum evaporation and sputtering;

wherein the solution applying step through the metal forming step are performed in an identical apparatus.

9. A method of fabricating an EL display device, comprising:

oxidizing a surface of a transparent conductive film;

applying a solution containing an EL material by spin coating, onto the transparent conductive film subjected to the oxidizing step;

baking said solution by a heat treatment after the solution applying step, thereby to form a thin film which is made of said EL material; and forming a metal film containing an element belonging to at least one of the group-1 and group-2 of a periodic table, on said thin film made of said EL material and by either of vacuum evaporation and sputtering;

wherein the surface oxidizing step through the metal forming step are performed in an identical apparatus.

10. A method of fabricating an EL display device according to either of claims 8 and 9, comprising:

forming an insulating film on said metal film by either of vacuum evaporation and sputtering, after forming said metal film;

wherein the insulating film forming step is performed in the apparatus.

11. A method of fabricating an EL display device, comprising:

forming a metal film containing an element belonging to at least one of the group-1 and group-2 of a periodic table, on a conductive film by either of vacuum evaporation and sputtering;

applying a solution containing an EL material, onto said metal film by spin coating;

baking said solution by a heat treatment after the solution applying step, thereby to form a thin film which is made of said EL material; and forming a transparent conductive film on said thin film made of said EL material and by either of vacuum evaporation and sputtering;

wherein the metal forming step through the transparent conductive forming step are performed in an identical apparatus.

12. A method of fabricating an EL display device according to claim 11, comprising:

forming an insulating film on the transparent conductive film by either of vacuum evaporation and sputtering, after the transparent conductive film forming step;

wherein the insulating film forming step is performed in the apparatus.

13. An apparatus, comprising:

a first chamber for applying a solution containing an EL material;

a second chamber for baking said solution;

a third chamber for forming a metal film containing an element belonging to at least one of the group-1 and group-2 of a periodic table;

means for transferring a substrate between said first to third chambers without exposing said substrate to air;

means for isolating said first to third chambers from each other; and means for enveloping an EL element comprising said EL material and said metal film in a sealed space, wherein at least one chamber is provided between said first chamber and said means for transferring a substrate and said chamber is an evacuation chamber.

14. An apparatus, comprising:

a first chamber for applying a solution containing an EL material;

a second chamber for oxidation;

a third chamber for forming a metal film containing an element belonging to at least one of the group-1 and group-2 of a periodic table;

means for transferring a substrate between said first to third chambers without exposing said substrate to air;

means for isolating said first to third chambers from each other; and means for enveloping an EL element comprising said EL material and said metal film in a sealed space, wherein at least one chamber is provided between said first chamber and said means for transferring a substrate and said chamber is an evacuation chamber.

15. An apparatus, comprising:
a first chamber for applying a solution containing an EL material;
a second chamber for baking said solution;
a third chamber for forming a metal film containing an element belonging to at least one of the group-1 and group-2 of a periodic table;
a fourth chamber for forming an insulating film;
means for transferring a substrate between said first to fourth chambers without exposing said substrate to air;
means for isolating said first to fourth chambers from each other; and
means for enveloping an EL element comprising said EL material and said metal film in a sealed space,
wherein at least one chamber is provided between said first chamber and said means for transferring a substrate and said chamber is an evacuation chamber.

16. An apparatus according to any one of claims 13 through 15, wherein a spin-coating apparatus is installed into said first chamber.

17. An apparatus according to any of claims 13 through 15, wherein a processing chamber for evacuation is interposed between said processing chamber for solution application and a gate corresponding thereto.

18. An apparatus according to any of claims 13 through 15, further comprising means for applying a member selected from the group consisting of a thermosetting resin and an ultraviolet-setting resin, so as to cover, at least, side surfaces of said substrate subjected to all processing steps, and means for setting the selected resin.

19. A method of manufacturing an EL display device, comprising:
applying a solution containing an EL material onto a conductive film over a substrate;
forming a thin film comprising said EL material by baking said solution after the solution applying step;
forming a metal film containing an element belonging to at least one of the group-1 and group-2 of a periodic table, on said thin film made of said EL material by vacuum evaporation or sputtering; and
enveloping an EL element comprising said conductive film, said thin film made of EL material, and said method film into a sealed space,
wherein the solution applying step through the enveloping step are performed in an apparatus without taking out the substrate to an outside of the apparatus.

20. A method of manufacturing an EL display device according to claim 19, further comprising:
forming an insulating film on said metal film by vacuum evaporation or sputtering, after forming said metal film;
wherein the insulating film forming step is performed in said apparatus.

21. A method of manufacturing an EL display device, comprising:
applying a solution containing an EL material over a substrate;
forming a first EL layer by baking said solution after the solution applying step;
forming a second EL layer by evaporation over said first EL layer;
forming a metal film containing element belonging to at least one of the group-1 and group-2 of a periodic table, on said second EL layer by vacuum evaporation or sputtering;
enveloping an EL element comprising, said first and second EL layers, and said metal film into a sealed space,
wherein the solution applying step through the enveloping step are performed in an apparatus without taking out the substrate to an outside of the apparatus.

22. A method of manufacturing an EL display device according to claim 21, comprising:
forming an insulating film on said metal film by vacuum evaporation or sputtering, after forming said metal film;
wherein the insulating film forming step is performed in said apparatus.

23. An apparatus comprising:
a transport chamber into or out of which a substrate is taken;
a common chamber including a mechanism for transporting said substrate; and
a plurality of processing chambers respectively connected to said common chamber through gates;
wherein said plurality of processing chambers include a processing chamber for solution application, a processing chamber for baking, and a processing chamber for vapor-phase film formation, and
wherein a chamber is provided between said common chamber and said processing chamber for solution application and said chamber is an evacuation chamber.

24. An apparatus according to claim 23, wherein said solution application is a spin-coating application.

25. An apparatus according to claim 23, said apparatus further comprising means for applying a member selected from the group consisting of a thermosetting resin and an ultraviolet-setting resin, so as to cover, at least, side surfaces of said substrate subjected to all processing steps, and means for setting the selected resin.

26. An apparatus according to claim 23, said apparatus further comprising means for applying a member selected from the group consisting of a thermosetting resin and an ultraviolet-setting resin, onto said substrate subjected to all processing steps, means for sticking said substrate and a sealing material together, with the selected resin, and means for setting said selected resin.

* * * * *